United States Patent
Kuo et al.

[11] Patent Number: 5,851,874
[45] Date of Patent: Dec. 22, 1998

[54] METHOD OF PLANARIZING MEMORY CELLS

[75] Inventors: Chan-Jen Kuo; Fu-Liang Yang, both of Tainan, Taiwan

[73] Assignee: Vanguard International Semiconductor Corporation, Hsinchu, Taiwan

[21] Appl. No.: 762,837

[22] Filed: Dec. 10, 1996

[51] Int. Cl.$^6$ .............................................. H01L 21/8242
[52] U.S. Cl. .......................................... 438/253; 438/250
[58] Field of Search ................................... 438/238–239, 438/250–256, 381, 393–398

[56] References Cited

U.S. PATENT DOCUMENTS 5,393,691  2/1995  Hsu et al. .
5,618,749  4/1997  Takahashi et al. .

*Primary Examiner*—Jey Tsai
*Attorney, Agent, or Firm*—Christensen O'Connor Johnson & Kindness PLLC

[57] ABSTRACT

A planarzation process is crucial for submicron VLSI or ULSI fabrication, The method of the present invention comprises forming a stacked capacitor contact on a substrate, forming a first dielectric layer on the capacitor contact. Next an etching process is performed to etchback the first dielectric layer. Finally, a second dielectric layer is formed on the first dielectric layer. A thermal reflowing may be also used to increase the planarization.

12 Claims, 2 Drawing Sheets

METHOD OF PLANARIZING MEMORY CELLS

FIELD OF THE INVENTION

The present invention relates to a method of planarization, particullary to a method of planarizing memory cells.

BACKGROUND OF THE INVENTION

Semiconductor devices are commonly formed a plurality of stacked layers of materials. The formation of semiconductor devices often times results in the formation of raised surfaces atop the semiconductor substrate. These surface contours are detrimental to subsequent process steps such as photolithography.

In order to minimize the effects of surface contouring as multiple layers are formed, various planarization processes are now commonly used. A planarization process is particularly crucial for submicron VLSI or ULSI fabrication, where the depth of focus (DOF) budget of photolithography is important.

As specifically applied to memory cells, planarization is particularly important. A memory cell typically comprises a transistor, a capacitor and contacts to external circuits. The capacitor used is often times a atacked capacitor that is formed on a substrate. The stacked capacitor tends to have abrupt edges and severe contours.

One prior art solution is to use a chemical vapor deposition of silicon dioxide heavily doped with boron and phosphorus (known as borophosphosilicate glass or BPSG) that can be easily reflowed. Reflowing of the BPSG allows both the sharp edges of openings and the hills formed by the oxide going over low-level leads to be smoothed. For a discussion of this process, see *Silicon Processing for the VLSI Era*, Vol. 1—*Process Technology*, S. Wolf and R. N. Tauber, Laffice Press 1986. Unfortunately, reflowing of BPSG requires temperatures higher than desirable for semiconductor devices that also incorporate aluminum. Another method of planarization is plasma etching. However, in general, plasma etching is only used for local planarization.

A recently introduced process that used a dielectric layer of plasma-enhanced low-temperature CVD TEOS together with a low-temperature thermal CVD TEOS. This combination allows narrow, high aspect ratio spacers between two stacked layers (e.g. metal lines) to be filled without the formation of voids. Planarization of CVD interlevel dielectric films can be achieved using the sacrificial-layer etchback process. The process is carried out by first depositing a CVD film which will serve as interlevel dielectric. This layer is then coated with a films (sacrificial-layer) that will be etched off. Typically, the thickness of the sacrificial-layer is 1–3 micron meter. Howver, this process tends by be complex.

SUMMARY OF THE INVENTION

A method of planarizing a memory cell on a semiconductor substrate is described. The method comprises the steps of forming a capacitor contact on said substrate, forming a first dielectric layer on said substrate and on said capacitor contact, etching said first dielectric layer to form side wall spacers on the sidewall of said capacitor contact, said etching leaving at least a residue of said first dielectric layer atop of said capacitor contact, and forming a second dielectric layer on said first dielectric layer.

In accordance with other aspects of the present invention, a further step of reflowing said second dielectric layer to increase the planarization of said second dielectric layer is disclosed.

In accordance with still other aspects of the present invention, a general method of planarization is disclosed. The method comprise the steps of forming a first dielectric layer on a stacked underlying layer which is formed over a semiconductor substrate, etching said first dielectric layer to form sidewall spacers on the sidewall of said stacked underlying layer such as a residue of said first dielectric layer is left on the top of said stacked underlying layer, and forming a second dielectric layer on said first dielectric layer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Initially, it should be pointed out that the formation of a capacitor described herein includes many conventional process steps that are well known in the art. Each of these steps are conventional and will not be described in detail herein.

Figure 1:
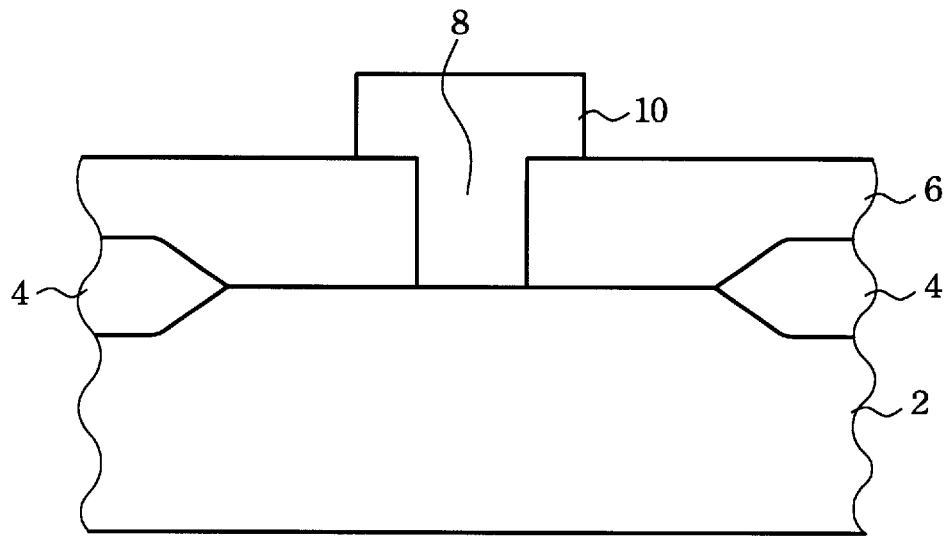
FIG. 1 is a cross section view of a semiconductor substrate illustrating the step of forming a base dielectric layer and forming a capacitor contact on a semiconductor substrate in accordance with the invention.

Referring to FIG. 1, a silicon substrate 2 for holding memory cells is shown. In the preferred embodiment, the single crystal substrate is P-type with a <100> crystallographic orientation. Typically the gate electrode of the access transistor is formed on the substrate 2. Similarly, source and drain impurity regions are also formed in the substrate 2. The formation of the access transistors for DRAMs is well known in the art and is not particularly germane to the present invention. Thus, only a cursory description of the transistors is given here. One example is seen in U.S. Pat. No. 5,489,791 to Arima et al.

Field oxide regions 4 are created for purposes of isolating the adjacent structures. A silicon nitride-silicon dioxide composite layer is deposited onto the substrate 2. A photoresist is applied to the composite layer that defines the FOX 4 region. After the photoresist is removed, and wet cleaned, thermal oxidation in an oxygen steam environment is used to form FOX 4. Preferably, FOX 4 has a thickness of about 4000–6000 angstroms.

A base dielectric layer 6 is formed on the substrate 2. In the preferred embodiment, the base dielectric layer is composed of silicon dioxide. Then a photolithography and an etching process are used to created a contact hole 8 which is formed in the dielectric layer 6. Subsequently, a capacitor contact 10 is formed on the contact hole 8. The capacitor contact 10 is electrically connected to the transistor via the contact hole 8.

Figure 2:
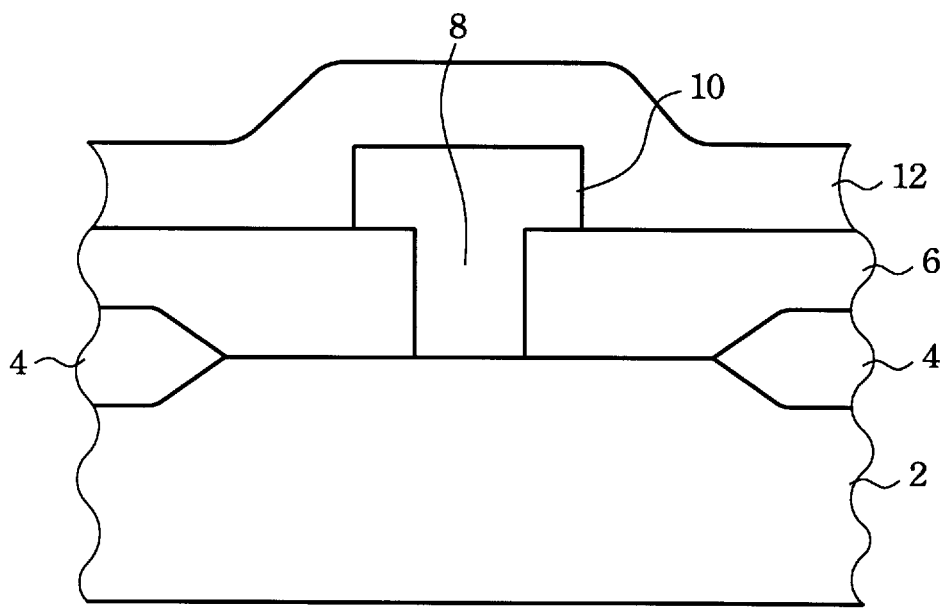
FIG. 2 is a cross section view of a semiconductor substrate illustrating the step of forming a first dielectric on the capacitor contact in accordance with the invention.

Turning next to FIG. 2, a first dielectric layer 12 is formed on the substrate 2. In preferred embodiment, the second dielectric layer 12 is composed of BPSG or TEOS-oxide. The BPSG layer can be formed by low pressure chemical vapor deposition using tetraethylorthosilicate (TEOS) as a reactant. Boron and phosphorus are added during the formation of the borophosphosilicate glass layer. The thickness of the BPSG layers is 2000 to 6000 angstroms. The TEOS-oxide layer is formed by using a chemical vapor deposition process, using TEOS as a source at a temperature between about 650° to 750° C., and to a thickness about 2000 to 6000 angstroms.

Figure 3:
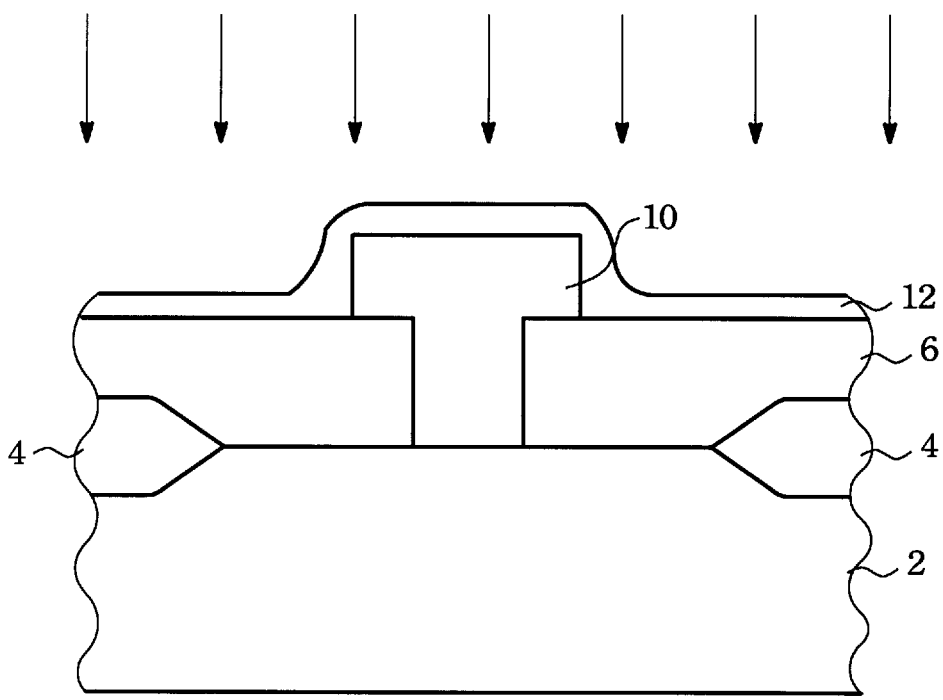
FIG. 3 is a cross section view of a semiconductor substrate illustrating the step of etching the first dielectric layer in accordance with the invention.

Turning next to FIG. 3, an anistropic etching are used to etch the first dielectric layer 12 to form side wall spacers on the side wall of the capacitor contact 10. As shown in FIG. 3, a thickness of approximately 500 to 1000 angstroms of the first dielectric is left after the etching in order to prevent the capacitor contact 10 from being damage by the etching.

Figure 4:
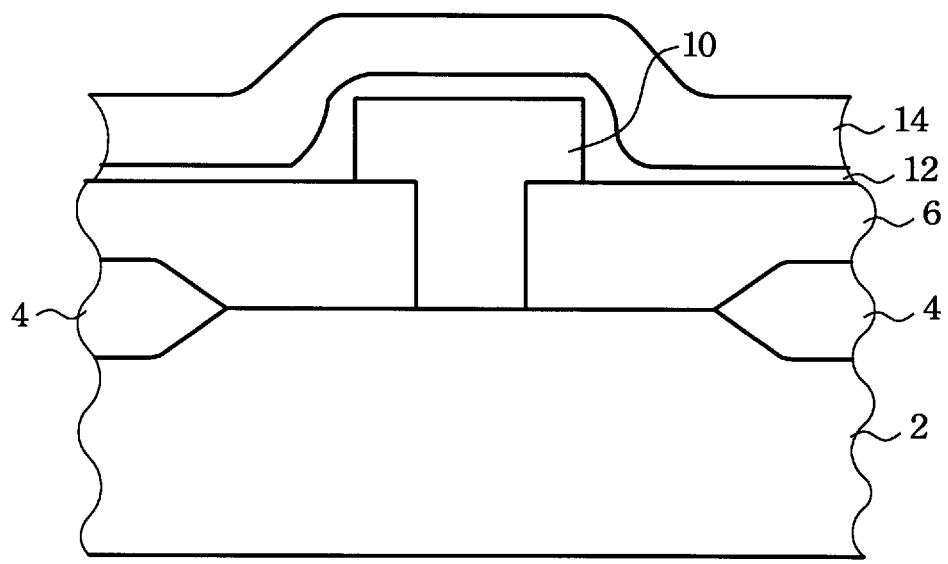
FIG. 4 is a cross section view of a semiconductor substrate illustrating the step of forming a second dielectric layer on the first dielectric layer in accordance with the invention.

Next, as seen in FIG. 4, a second dielectric layer 14 is formed on the first dielectric layer 12 to have a thickness of a range about 2000 to 8000 angstroms. Simillary, the second dielectric layer 14 is composed of BPSG or TEOS-oxide. Then a thermal reflowing process is performed to the second dielectric layer 14, which reduced its softening temperature and allows it to be reflowed. Reflowing allows the sharp edges of the contours formed by the first and second dielectric layer 12, 14 going over the capacitor contact 10 to be smoothed. The temperature of the process is about 800°–875° C. It should be noted that additional dielectric layers can be deposited and reflowed to further planarize the surface of the capacitor contact 10.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method of planarizing a memory cell on semiconductor substrate, said method comprising the steps of:

forming a capacitor contact on said semiconductor substrate;

forming a first dielectric layer on said substrate and on said capacitor;

etching said first dielectric layer to form side wall spacers on the side wall of said capacitor contact, and etching leaving at least a residue of said first dielectric layer atop of said capacitor contact; and forming a second dielectric layer on said first dielectric layer.

2. The method of claim 1, further including the steps of reflowing said second dielectric layer to increase the planarization of said second dielectric layer.

3. The method of claim 1, wherein said first dielectric layer is composed of BPSG (borophosphosilicate glass).

4. The method of claim 3, wherein said first dielectric layer is formed to have a thickness about 2000 to 6000 angstroms.

5. The method of claim 1, wherein said first dielectric layer is composed of TEOS-oxide.

6. The method of claim 5, wherein said first dielectric layer is formed to have a thickness about 2000 to 6000 angstroms.

7. The method of claim 1, wherein said second dielectric layer is composed of BPSG.

8. The method of claim 7, wherein said second dielectric layer is formed to have a thickness about 2000 to 8000 angstroms.

9. The method of claim 1, wherein said second dielectric layer is composed of TEOS-oxide.

10. The method of claim 9, wherein said second dielectric layer is formed to have a thickness about 2000 to 8000 angstroms.

11. The method of claim 2, wherein the temperature of said reflowing is about 800°–875° C.

12. The method of claim 1, wherein the thickness of said first dielectric layer left on the top of said capacitor is about 500 to 1000 angstroms.

* * * * *